(12) United States Patent
Kato

(10) Patent No.: US 6,222,377 B1
(45) Date of Patent: Apr. 24, 2001

(54) CIRCUIT BOARD PROBE DEVICE

(76) Inventor: Masatoshi Kato, 2800-62 Yamamiya-cho, Ko-tu, Yamanashi (JP)

(*) Notice: Subject to any disclaimer, the term of this patent is extended or adjusted under 35 U.S.C. 154(b) by 0 days.

(21) Appl. No.: 09/006,139

(22) Filed: Jan. 13, 1998

(51) Int. Cl.[7] ................................................. G01R 31/02
(52) U.S. Cl. .............................................. 324/754; 324/761
(58) Field of Search ................................. 324/754, 761, 324/72.5, 73.1

(56) References Cited

U.S. PATENT DOCUMENTS

| 4,801,876 | * | 1/1989 | Nanzai ................................ 324/761 |
| 4,935,696 | | 6/1990 | DiPerna ............................. 324/158 |
| 5,227,718 | | 7/1993 | Stowers et al. ................... 324/72.5 |
| 5,233,290 | | 8/1993 | Swart ................................. 324/72.5 |
| 5,420,519 | * | 5/1995 | Stowers et al. ................... 324/72.5 |
| 5,493,230 | * | 2/1996 | Swart et al. ..................... 324/761 X |
| 5,557,213 | * | 9/1996 | Reuter et al. ..................... 324/761 |
| 5,781,023 | * | 7/1998 | Swart et al. ....................... 324/761 |

FOREIGN PATENT DOCUMENTS

| 61-30876 | 2/1986 | (JP) . |
| 63-181969 | 11/1988 | (JP) . |
| 64-2181 | 1/1989 | (JP) . |
| WO97/43652 | 11/1997 | (WO) . |

* cited by examiner

Primary Examiner—Josie Ballato
Assistant Examiner—T. R. Sundaram
(74) Attorney, Agent, or Firm—Testa, Hurwitz & Thibeault, LLP

(57) ABSTRACT

A probe is provided for electrically testing high-density printed circuit boards on a bed of nails test fixture. An elongated probe is provided with a fixed contact point interfacing with the PCB under test and a spring loaded probe on the opposite end of the probe barrel contact the interface between the test fixture and test equipment. A mechanism is provided which maintains the probe in precise perpendicular orientation to the X and Y planes while permitting movement of the probe along its axis in the Z plane.

4 Claims, 6 Drawing Sheets

Prior Art

CIRCUIT BOARD PROBE DEVICE

RELATED APPLICATIONS

This application is related to U.S. Ser. No. 08/981,926 filed on Jan. 12, 1998 which is based on PCTJP 97/01582 filed on May 12, 1997.

BACKGROUND OF THE INVENTION

Printed circuit boards are typically tested using a device consisting of an array of pogo pins. The device is positioned on the board so that the pogo pins contact leads of the components on the printed circuit board. The circuit board is then tested by measuring electric current through the pogo pins. FIG. 1 shows one example of a commonly used pogo pin. This probe is composed of two subassemblies, a socket (47), and a moveable probe assembly (48) which is inserted into the socket (47) to form a complete pogo pin assembly (51). The pogo pin is used to deliver repeated electrical access to the Printed Circuit Board (PCB) under test. The socket (47) provides 2 functions: it allows the probe assembly (48) to be easily replaced after wear or damage, and it prevents potential damage to the delicate probe assembly (48) on insertion of the socket (47) into the alignment plate 41 (FIG. 2).

The probe assembly (48) includes a probe body (49), a probe spring (50) and a probe tip (46). The socket assembly (47) includes a socket body (44) and a socket tail (43). The probe tip (46) contacts a test pad on the PCB when the PCB is compressed onto the pogo pin tip. To complete the electrical connection between the PCB and the test system, the socket's tail (43) contacts a translation board as the fixture interface or alternatively is wire wrapped to the fixture interface.

The socket is forced into a thick plate of material (41) in order to be held in place during use (FIG. 2). The plate (41) also serves to counteract the force used to compress the PCB under test on to the pogo pins.

A typical application (e.g., PC motherboard) requires in excess of 1000 pogo pins. A standard 0.025" probe would use a spring with 4 ounces of force at ⅔ compression. In a PC motherboard application, the thick plate of material (41) would have to support a pressure of over 250 pounds. In order to counteract such a high force without deformation, a very thick fiberglass and glass composite is utilized for the plate material. This material is generally referred to as "G-10". This material is very thick, averaging about one half inch, and very difficult to drill straight holes for socket 47 (FIG. 1) insertion. If the holes are not straight, the assembled pogo pin will not be perpendicular to the PCB. In this case, the probe may miss its target and will succumb to excessive wear and early life failure.

The drill bit's strength is limited by their size and their ability to maintain a precisely perpendicular hole is impacted by the thickness and length of the drill and the consistency of the material being drilled. G-10, the material (41) used to hold the probe socket 47 in place, is a molded material that uses inconsistent fiber sizes within. The strength, thickness and inconsistency of the material make it very difficult to drill straight. In an attempt to overcome this problem many different drill processes have been experimented with and several are in use today. The more consistent processes require drilling shallow holes from each end side of the material. This reduces the distance the drill bit can drift from the desired position. It also adds cost and increases the time required to complete the fixture.

Even thick G-10 material cannot resist the constant pressure from the probes. Over time, the G-10 material deforms and the socket deviates from it's perpendicular position. Replacement of pogo pins causes stress on the socket which can further affect perpendicularity.

SUMMARY OF THE INVENTION

A probe fixture assembly of the invention includes a base fixture plate attached to an alignment plate. A probe of the invention is inserted through a hole in the alignment plate, and the tail of the probe contacts the fixture plate. In a preferred embodiment, the invention includes multiple probes. In a more preferred embodiment, the invention includes two alignment plates. In a most preferred embodiment, the invention includes a series of three or more alignment plates.

A probe tip assembly of the invention includes a probe tip that is attached to a probe body. The probe body is connected to a probe tail via a spring. In a preferred embodiment, the probe tip is removable and replaceable. In a further preferred embodiment, the probe tip assembly includes a flange. The flange is preferably on the probe body to prevent it from falling through the alignment plate. In a most preferred embodiment, the flange is positioned such that the probe body is pressed toward the probe tail, thereby preloading the spring between the probe body and probe tail. In this embodiment, the resting position of the probe body is determined by the flange which abuts the alignment plate, and the resting position of the tail is determined by the fixture plate which contacts the tail. The relative distance between the fixture plate and the alignment plate affects the preloading of the spring.

DETAILED DESCRIPTION

Figure 1:
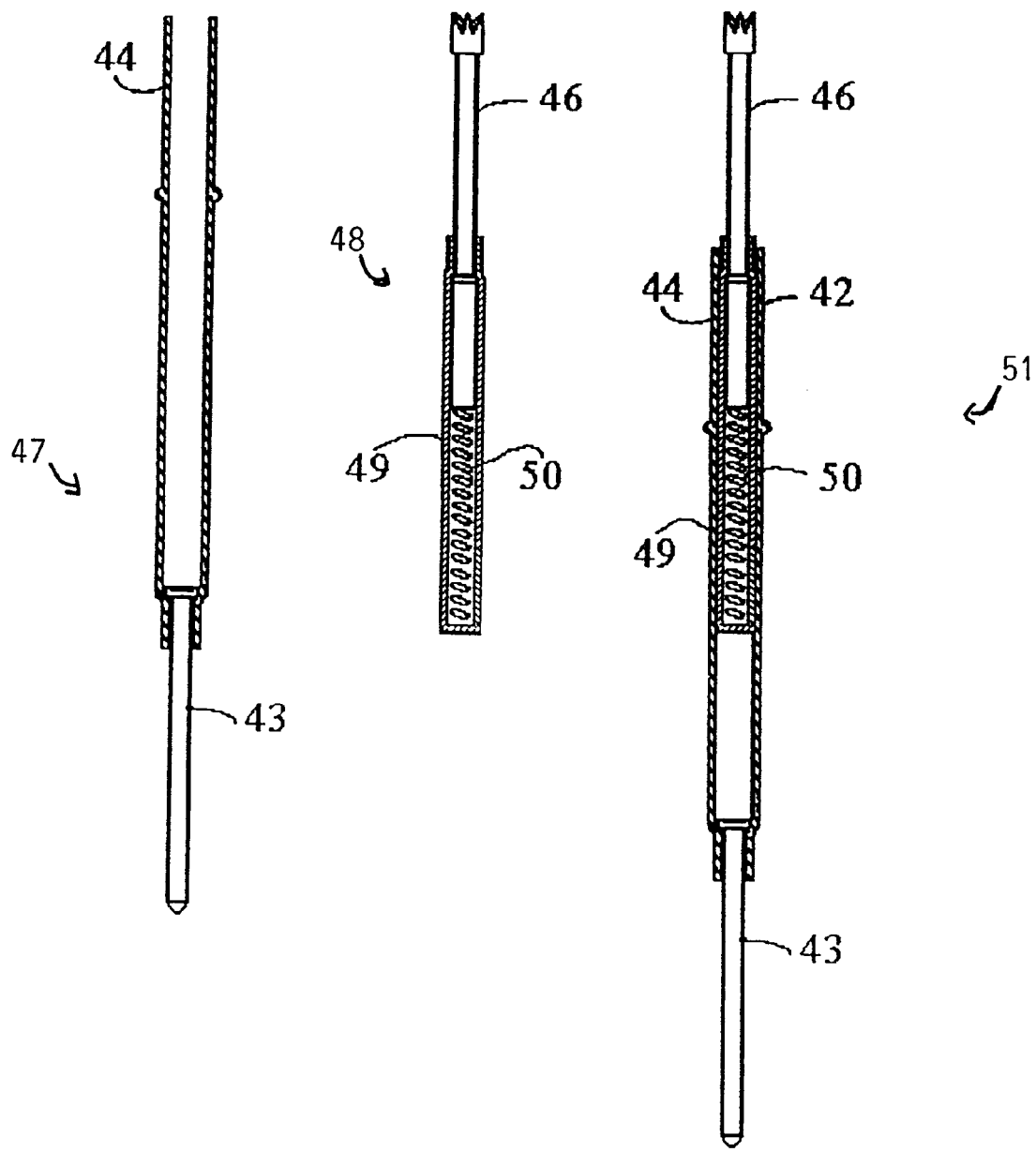
FIG. 1 shows a prior art pogo pin.

This invention completely redefines the pogo pin (the 'probe') and by doing so dramatically increases available probe density, reduces fixture costs, increases probe life and reduces ongoing maintenance costs. A probe of the invention does this by transferring the spring force of a probe from a fixture alignment plate to a fixture base plate. In a preferred embodiment of the invention, a probe tip is stationary within the probe assembly, while the base of the assembly provides the required travel. This is upside down from (or the reverse of) the traditional pogo pin. By doing so the alignment plate(s) only has to maintain perpendicularity of the probes and no longer counteracts the force of the probes.

A probe of the invention includes several features that distinguish it from a standard pogo pin.

In a preferred embodiment, a probe of the invention is a single piece construction. Traditional pogo pins are housed in a socket which is mounted in an alignment plate. The socket serves two purposes—it allows easy replacement of the pogo pin and allows press-fitting into the alignment plate without damaging the pogo pin. In contrast, a probe of the invention is movable in the alignment plates (not press-fit), therefore it is easy to replace and is not easily damaged on insertion.

In a preferred embodiment, a probe of the invention is upside down when compared to a standard pogo pin. Traditionally, pogo pins have spring-loaded moving tips which contact the Unit Under Test (UUT). In contrast, a spring-loaded tip of the invention contacts the test system interface (at the contact plate/base fixture plate).

In a preferred embodiment, a probe of the invention includes an interchangeable tip. Traditional pogo pins are replaced due to contamination/wear after 30,000 actuations. The entire spring-loaded pogo pin is replaced. In contrast when a probe pin of the invention fouls, only the low-cost tip is replaced—the spring loaded tip is re-used. Furthermore, traditional pogo pins cannot be cleaned to remove contamination. After immersion in cleaners, pogo motion lubricant is reduced, yielding rapid wear. In contrast a probe of the invention has no moving parts or lubricants, it can be cleaned and re-used.

In a preferred embodiment, an assembled probe of the invention includes a spring that is pre-loaded before UUT contact. Standard pogo pin springs have relatively linear pressure curves—as the pogo strokes, the pressure between the tip and the PCB is raised. Traditional pogo pins rest in a fully-extended position. They contact the PCB with low resistance and gradually build up force as the pogo strokes and the spring compresses. In contrast, in a preferred embodiment, a probe of the invention rests in a partially compressed state. Thus, when the tip first contacts the PCB, the contaminant-penetrating force is higher than the force of traditional probes. This provides several advantages. In one embodiment, lower force probes are used to obtain the same contamination penetration as traditional probes. Lower force probes deliver less stress/damage to the PCB. In another embodiment, higher contamination penetration is obtained for the same spring force.

A probe fixture of the invention includes several features that distinguish it from a standard fixture.

In a preferred embodiment a fixture of the invention includes multiple alignment plates. Traditional pogo pins/sockets are mounted in a single, thick alignment. It is difficult to drill straight holes in thick alignment plates. In contrast, very straight holes can be drilled into the thin alignment plate(s) of a fixture of the invention via simple processing.

In a preferred embodiment of the invention, the probe moves freely within the mounting/alignment plates. In traditional fixtures, the socket is press-mounted into the alignment plate. The pogo is then inserted into the socket. When pins wear out and are removed, force is applied to the socket and alignment plate, causing wear and reduced accuracy. In contrast, replacement of a probe tip of the invention causes no force on the alignment plates.

In a preferred embodiment of the invention the pressure is on the contact plate, not the alignment plates. In the traditional fixture, when the pogo pin compresses, the force is applied to the socket and alignment plate. Over time, this force causes wear in the socket and alignment plate resulting in reduced accuracy. In contrast, in an embodiment of the invention, the force of the pogo pin is applied to the contact plate - the alignment plates float.

Figure 3:
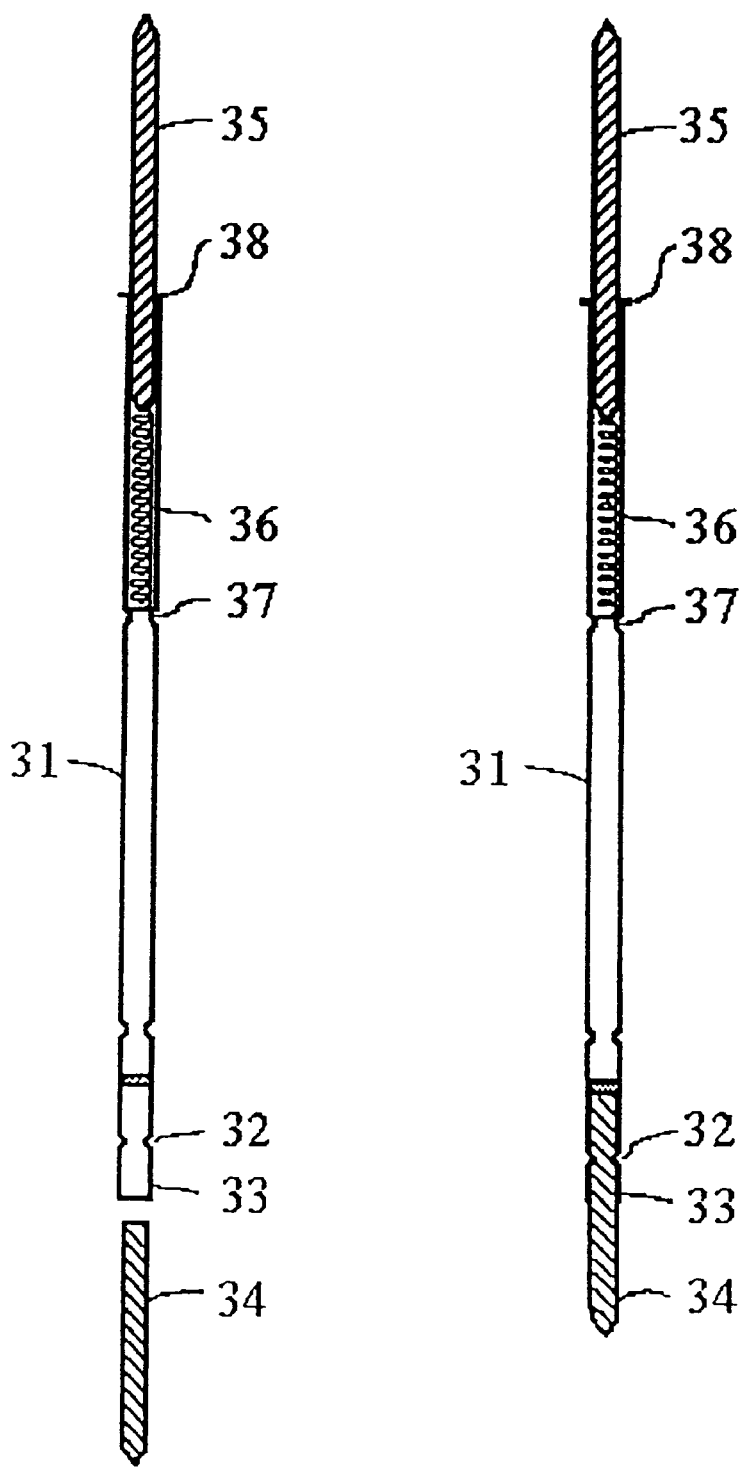
FIG. 3 shows an embodiment of a probe of the invention.

FIG. 3 illustrates a preferred embodiment of the invention. It is a single subassembly comprised of a simple probe tip (34), a probe body (31), a probe tail (35) and a spring (36). A variety of probe tips (34) are provided to accommodate different height targets and different target types. Traditional fixtures require probe sockets with different length barrels to accommodate differing height targets, adding to the complexity and cost of using traditional style pogo pins.

Figure 5:
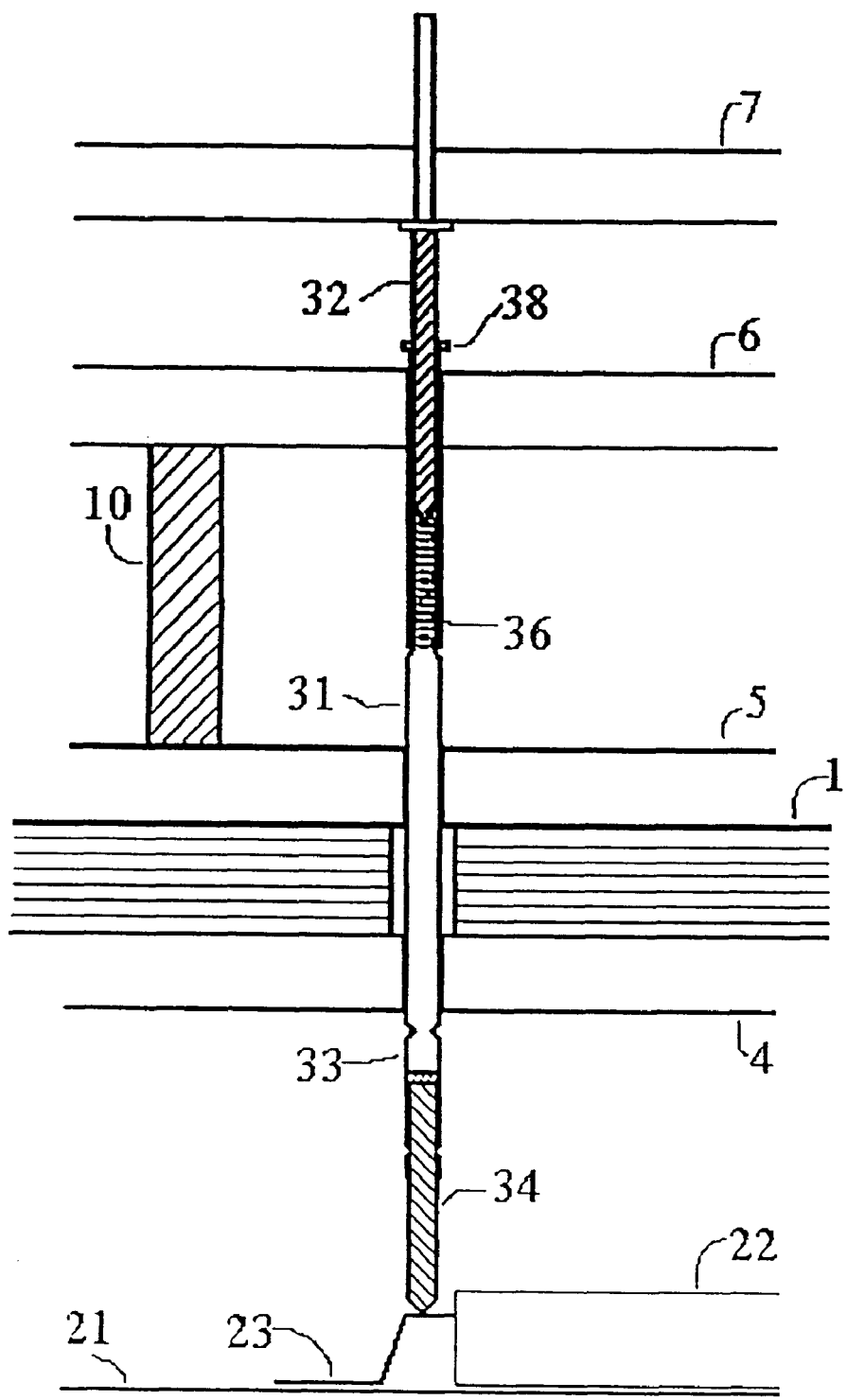
FIG. 5 shows an embodiment of a probe in contact with a PCB.

Unlike the traditional pogo pin shown in FIG. 1, a tip of the invention (34) can not move independently of the probe body. Due to the elimination of movement between the probe tip (34) and the probe body (33) a tip of the invention will not wear over time as pogo pins do. Experiments have shown that typical pogo pin probes have a useable life of approximately 50,000 cycles, while the tip of a probe of the invention has an approximate life of 1,000,000 cycles. This results from the transfer of the spring pressure from the moveable tip of the traditional pogo pin 48 (FIG. 1) to the tail of a probe of the invention and the proximity of the outer most alignment plate to the unit under test (FIG. 5).

In a preferred embodiment, the interchangeable tip of a probe of the invention can be removed and cleaned or replaced as wear occurs. A prior art pogo pin's probe assembly 48 (FIG. 1) cannot be cleaned or reused. When the pogo pin probe assembly 48 (FIG. 1) is cleaned the lubricant inside of the probe body 50 (FIG. 1) is removed, resulting in accelerated breakdown of the probe. Since the tip of a probe of the invention 34 (FIG. 3) does not have any moving parts it can be removed and cleaned. With the ability of a probe of the invention to clean contaminants from the probe tip and reuse the tip, its life cycle cost is considerably lower.

In a preferred embodiment, the elimination of the probe socket from a probe of the invention reduces the total diameter of the probe assembly. The smaller diameter probe and the transferring of the spring force to the base fixture plate allow probes of the invention to be placed in close proximity to each other. In typical applications the pogo pin is limited to 0.02" spacing on center. In one embodiment a probe of the invention is capable of 0.01" spacing on center.

In many applications today the PCB can be covered with contamination that the probe has to cut through in order to make good electrical contact with the printed circuit board under test. In order to do this, a preferred embodiment of a probe of the invention preloads a spring force on the probe tip 34 (FIG. 3) so that from the moment it contacts the PCB it has sufficient force to penetrate the contamination. This preloading of the spring also reduces the required travel of the probe, reducing the potential for the probe to 'walk' once it has hit its target.

Figure 4:
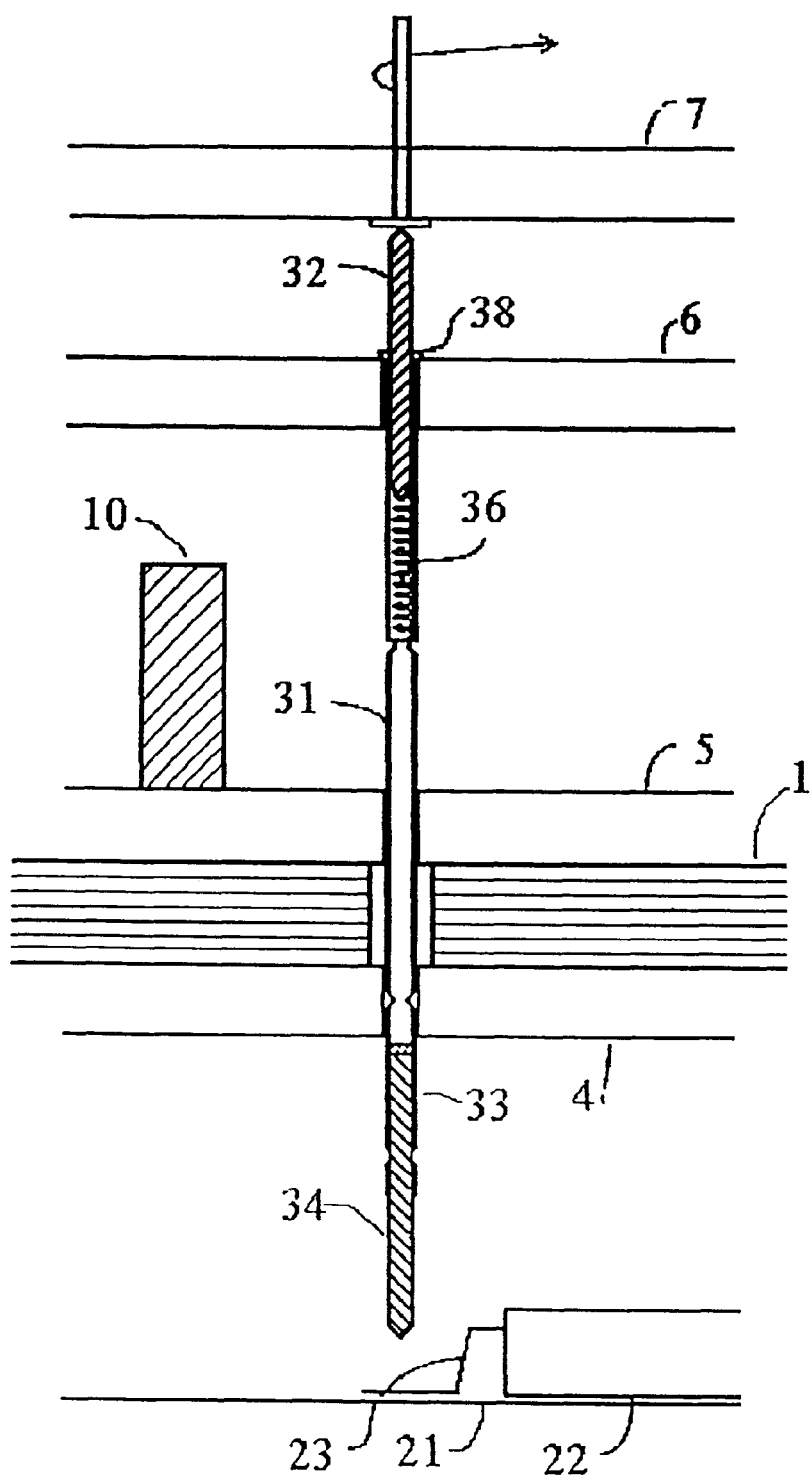
FIG. 4 shows an embodiment of a probe above a PCB.

FIGS. 4 and 5 illustrate how the spring force is transferred to the fixture interface panel in a preferred embodiment of the invention. FIG. 4 illustrates a preferred embodiment with guide plates/alignment plates (4, 5 and 6) holding a probe of the invention in place prior to contacting the PCB (21). In a preferred embodiment, a flange (38) on the body of a probe of the invention holds the probe from dropping through the guide plates. FIG. 5 illustrates a probe of the invention compressing within the guide plates as it contacts the lead (23) of a component (22) and transferring the pressure to the fixture interface (7). In FIG. 5 the fixture interface (7) is in a fixed position and is not intended to provide any positional control of a probe of the invention. The fixture interface (7) has two functions, counteracting the spring pressure of probes of the invention and transferring electrical connection from a probe of the invention to the test equipment.

The invention includes probes and fixtures having other features allowing preloading of the springs prior to contact with the PCB. Springs that are useful for the probes of the invention include devices that are resilient and exert force to return to their original configuration after being forced to adopt a new configuration.

In a preferred embodiment, the plate(s) (e.g. 4, 5 and 6 in FIG. 4) that hold(s) probes of the invention in a precise position do not have to counteract the force used to compress the PCB under test onto probes of the invention. This allows plate material that is thinner to be used to maintain the alignment of the probes. This simplifies the drilling process, increases accuracy of the probes in repeatably hitting the targets, lowers the manufacturing cost and makes it very easy to add probes as the PCB design changes.

Figure 2:
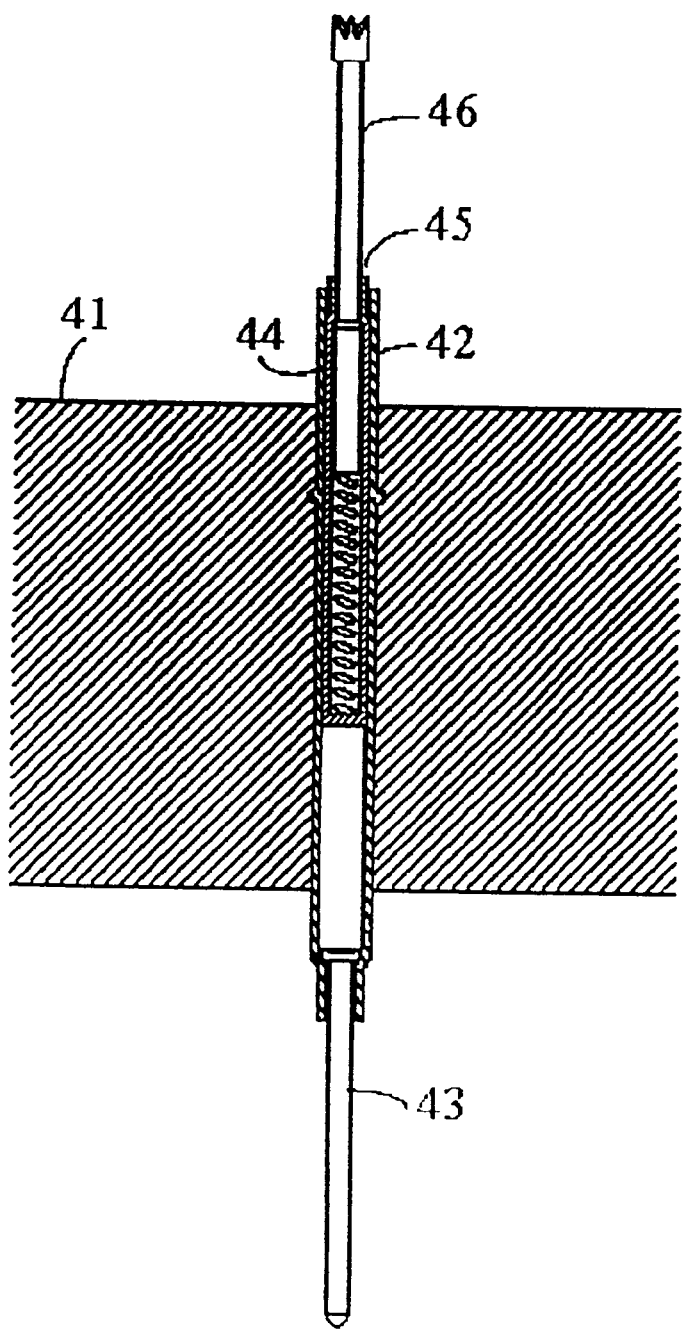
FIG. 2 shows a prior art pogo pin in a probe plate.

By transferring the pressure from the plate holding the pogo pins 41 (FIG. 2) to the fixture interface 7 (FIG. 4) panel supporting probes of the invention, the stress on the alignment plates is eliminated. This increases repeatability in hitting the targets on the PCB under test dramatically. In the case of the 0.01" (10 mil) probe, a typically PC motherboard with 1400 probes, would experience more than 100,000 cycles without a failure due to missing the target. This equates to 140 million contacts without a failure.

Figure 6:
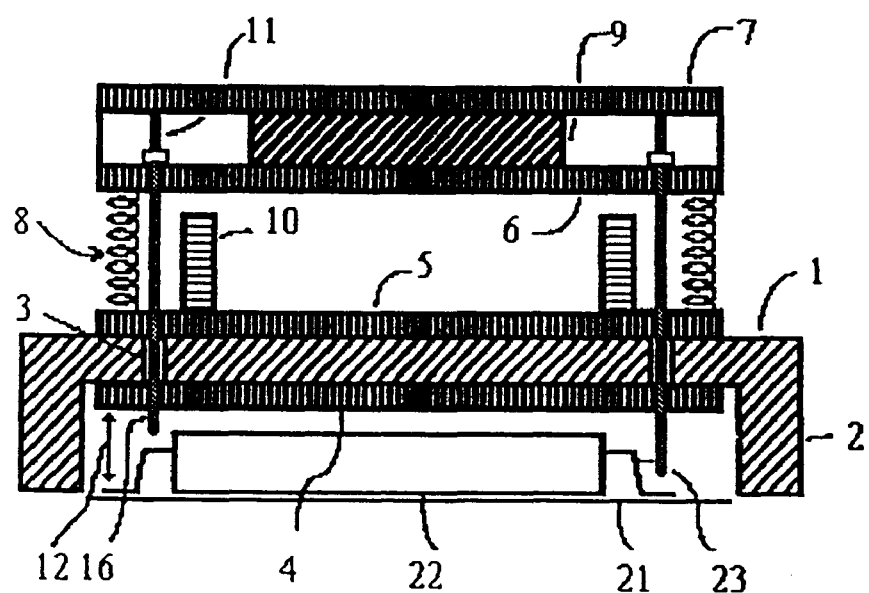
FIG. 6 shows an embodiment of a probe fixture of the invention.
Figure 6:
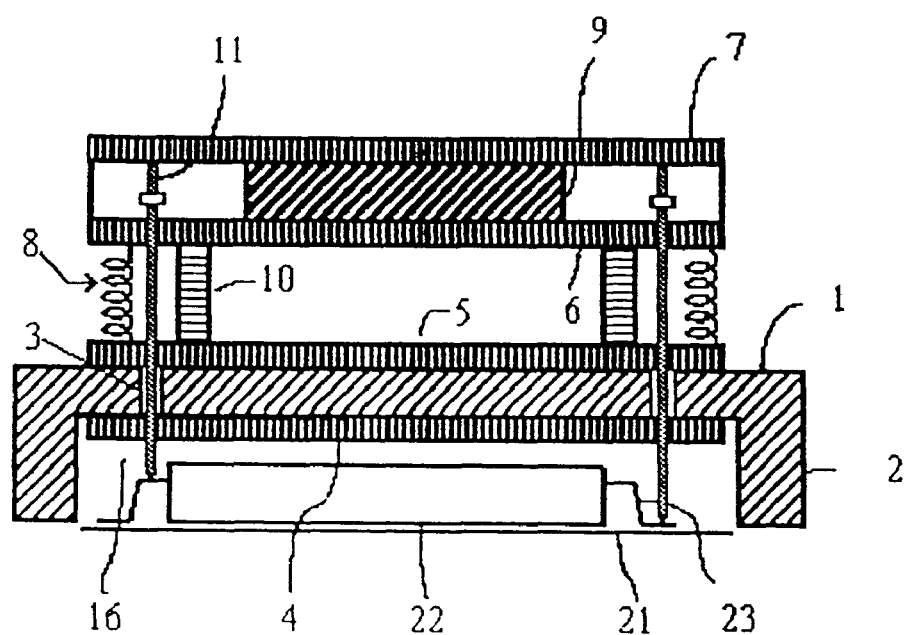

FIG. 6 illustrates a preferred embodiment of a fixture assembly of a probe according to the invention. In this figure, the fixture is pressed down from above the PCB onto the PCB (21) under test. When the fixture is lowered, the probes (16) will contact the component leads or lead pads of the PCB under test (21). The fixture interface panel (7) and the upper alignment plate (6) are held a fixed distance from each other by the spacer (9). This is done to preload the spring pressure on the tail (11) of the probes. When the fixture is lowered, the stop block (10) will limit the total amount of probe travel and pressure that is placed on the PCB.

What is claimed is:

1. A probe fixture assembly comprising:

a base fixture plate;

an alignment plate defining a bore therethrough, wherein said alignment plate is attached to said fixture plate; and, a probe having a probe body, a probe tip, and a probe tail connected to said probe body, wherein said connection permits movement of said probe tail relative to said probe body, and wherein said probe body is slidably inserted in said bore and said probe tail contacts said base fixture plate.

2. A probe assembly comprising:

probe tip removably attached to a probe body; and, a probe tail connected to said probe body via a spring, wherein said spring permits movement of said probe body relative to said probe tail.

3. The probe tip assembly of claim 2, wherein said probe body comprises a flange.

4. The probe fixture assembly of claim 1 comprising the probe tip assembly of claim 3, wherein said flange abuts said alignment plate thereby preloading said spring.

* * * * *